United States Patent [19]

Tidrow et al.

[11] Patent Number: 5,432,313

[45] Date of Patent: Jul. 11, 1995

[54] TARGET CONFIGURATIONS FOR INCREASING THE SIZE OF FILMS PREPARED BY LASER ABLATION

[75] Inventors: Steven C. Tidrow, Eatontown; William D. Wilber, Neptune; Arthur Tauber, Elberon, all of N.J.

[73] Assignee: The United States of America as represented by the Secretary of the Army, Washington, D.C.

[21] Appl. No.: 81,593

[22] Filed: Jun. 23, 1993

[51] Int. Cl.⁶ .............................................. B23K 26/00
[52] U.S. Cl. ............................ 219/121.68; 219/121.69; 427/596
[58] Field of Search ................. 219/121.68, 121.69, 219/121.65, 121.66, 121.15, 121.16; 427/596, 597; 204/192.1

[56] References Cited

U.S. PATENT DOCUMENTS

| | | | |
|---|---|---|---|
| 4,281,030 | 7/1981 | Silvfast | 427/53.1 X |
| 4,758,388 | 7/1988 | Hamada et al. | 219/121.66 X |
| 5,064,520 | 11/1991 | Miyake et al. | 204/192.11 |
| 5,084,300 | 1/1992 | Zander et al. | 427/597 |

*Primary Examiner*—C. L. Albritton
*Attorney, Agent, or Firm*—Michael Zelenka; William H. Anderson

[57] ABSTRACT

Uniform films deposited on substrates by laser ablation of targets are increased in size by configuring irradiated target areas as curves rather than flat surfaces. Since material ejected from the target area leaves in a direction normal to the target area, a curved surface results in the material following a trajectory which is at an acute angle to the surface of the substrate being coated. This results in a cone of ejected material which diverges, thus covering an area larger than the irradiated target area. The irradiated target area may be convex, concave or be comprised of a plurality of juxtaposed convex surfaces.

3 Claims, 2 Drawing Sheets

TARGET CONFIGURATIONS FOR INCREASING THE SIZE OF FILMS PREPARED BY LASER ABLATION

GOVERNMENT INTEREST

Government interest of the invention described herein may be manufactured, used and licensed by the Government of the United States of America without the payment to us of any royalty thereon.

FIELD OF THE INVENTION

This invention relates in general to preparing uniform films by laser ablation, and more particularly, the instant invention relates to target configurations for increasing the size of uniform films prepared by laser ablation.

BACKGROUND OF THE INVENTION

Various microwave devices such as resonators, delay lines, filters, antennae and distribution networks for antennae utilize components which are coated with uniform films prepared by laser ablation. Active electronic devices such as flux flow and SNS devices, as well as passive electronic devices such as impedance matching transformers, also use uniform films prepared by laser ablation. The components being coated may be of any material with magnesium oxide and lanthanum aluminate being preferred.

The material ablated by the laser to prepare the uniform film may be selected from a number of materials, but the primary material used is yttrium barium cuprate ($YBa_2Cu_3O_{7-\Delta}$). In accordance with prior art procedures and as illustrated in FIG. 1, a flat disk of this target material or other target material is impinged upon by an eximer laser beam. The laser beam causes particles of the material to erode from the target and be ejected into cones within a solid angle of about 5° having a centroid normal to the surface of the irradiated portion of the target. Therefore, the area on the substrate being coated can only be slightly larger than the irradiated target area. Accordingly, because target materials are typically only provided as disks which are smaller than the device or component that is to be coated, it is necessary to shift the target or substrate laterally with respect to one another in order to coat the desired area. As those skilled in the art recognize, this complicates the processing of substrates and leads to situations in which the film coating the substrates is not uniform due to film overlap.

In view of the aforementioned shortcomings in utilizing a target with a flat target area, there is a need for an approach to coat larger areas of substrates utilizing targets of conventional or readily available diameters.

SUMMARY OF THE INVENTION

It is a feature of the instant invention to increase the area of material deposited on a substrate by laser ablation of a target material.

In view of this feature and other features, the instant invention contemplates the improvement of configuring a portion of the target material surface as a curved surface wherein the ejected material emerges from the curved surface at an angle which is significantly greater with respect to a normal vector than is the case with a flat, planar surface.

In accordance with one embodiment of the instant invention, the irradiated portion of the target is a single convex surface.

In accordance with another embodiment of the invention, the irradiated portion of the target comprises a plurality of convex surfaces.

In accordance with still another embodiment of the instant invention, the irradiated portion of the target is a single concave surface or a plurality of annexed concave surfaces.

BRIEF DESCRIPTION OF THE DRAWINGS

These and other objects, features, and details of the invention will become apparent in light of the ensuing detailed disclosure, and particularly in light of the drawings wherein.

DETAILED DESCRIPTION

Figure 1:
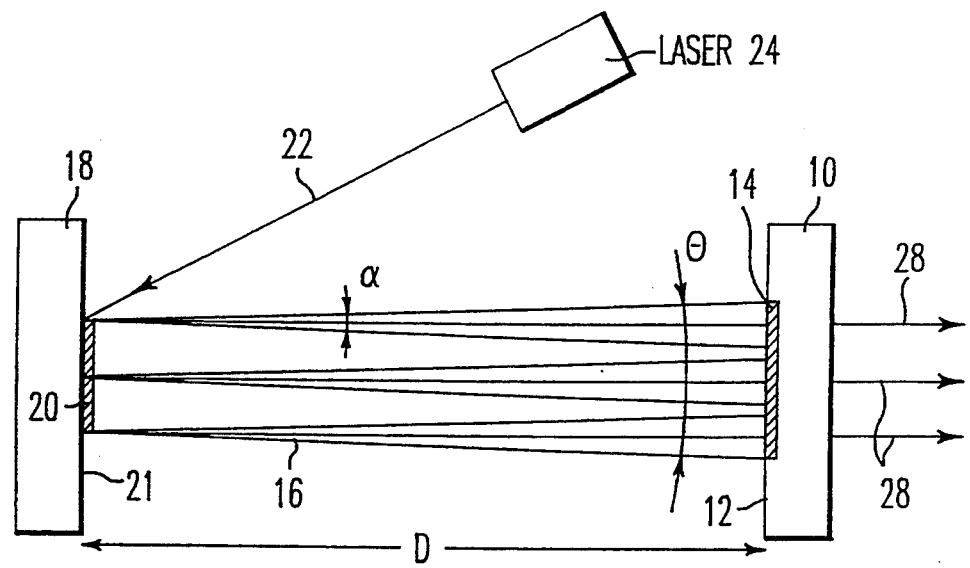
FIG. 1 is a schematic view of a prior art arrangement for depositing uniform films on a substrate by laser ablation of a target material.

Prior Art Configuration—FIG. 1

Referring now to FIG. 1, there is shown a substrate 10 having a surface 12 upon which a uniform film 14 is deposited by laser ablation of a material 16 from a target 18. Material 16 is ejected from a laser irradiated portion 20 on the surface 21 of the target 18 upon striking the irradiated portion of the target with a laser beam 22 generated by a laser 24.

In the prior art, the material 16 is ejected from the irradiated area 20 of the target in the shape of cones with a solid angle $\alpha$ of about 5° having centroids 28 extending substantially normal to the surface 12 of the substrate 10 and surface 21 of the target 18.

Examples of the material of which the substrate 10 may be made are dielectrics such as magnesium oxide and lanthanum aluminate ($LaAlO_3$). The preferable material 16 which forms the thin film 14 is yttrium barium cuprate ($YBa_2Cu_3O_{7-\Delta}$) wherein the exact amount of oxygen is a variable. The target 18 is preferably a disk which is in the range of 2.5 to 5 cm in diameter and in the range of about 0.32 to about 0.64 cm thick.

The target 18 is displaced from the substrate 10 at a distance of about 5–10 cm and the laser is preferably an eximer laser which deposits a film 14 having a thickness in the range of about 10 to about 1000 nm. The eximer laser 24 is preferably a krypton-fluorine laser having a wavelength of 248 nm and a power in the range of 100–600 mJ per pulse with a preferred or typical power of about 300 mJ per pulse. The pulse rate is in the range 1/10 to 80 pulses per second and with a typical pulse rate of about 10 pulses per second.

Figure 2:
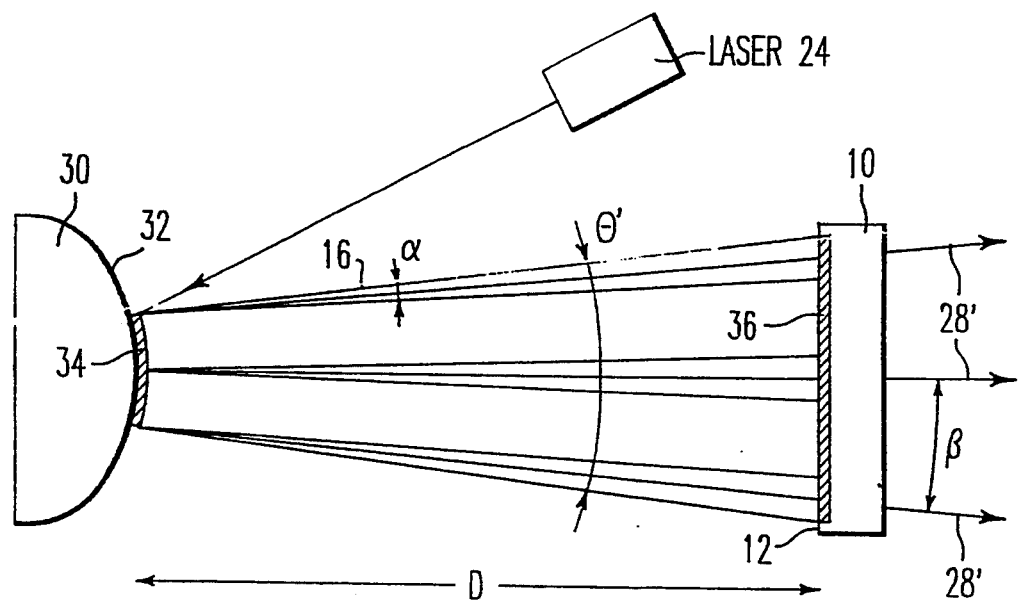
FIG. 2 is a schematic view of a process in accordance with a first embodiment of the instant invention wherein a target of a curved, laser irradiated portion is provided.

First Embodiment of Invention—FIG. 2

Referring now to FIG. 2, where the first embodiment of the instant invention is illustrated, a target 30 has a different configuration from the target 18 in that the surface 32 of the target 30 is convex so as to provide a convex laser irradiated portion 34. The material 16 is ejected from the target area 34 in the shape of cones having the angle α of about 5°, however, the normal components 28' now diverge at an angle B instead of being parallel to one another as are the normal components 28 of FIG. 1. Since the normal components 28' diverge in FIG. 2 (as represented by the different between Θ and Θ'), the surface 12 of the substrate 10 has a uniform film 36 which has an area considerably larger than the area 14 of FIG. 1. This is the case even though the laser irradiated portion 34 of the target 30 is the same size as the laser irradiated portion 20 of FIG. 1.

Figure 3:
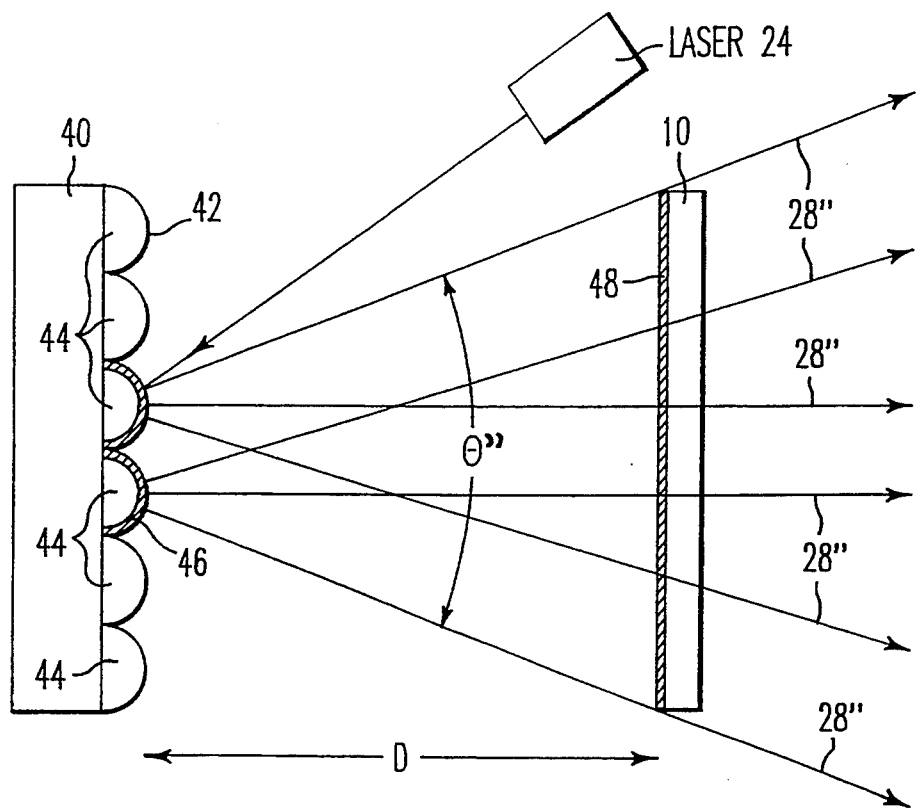
FIG. 3 is a schematic view of a process of the instant invention in accordance with a second embodiment thereof wherein a target has a laser irradiated, target area comprised of a plurality of convex curvatures.

Referring now to FIG. 3, there is shown a second embodiment of the instant invention wherein a target 40 is provided which has a surface 42 defined by a plurality of dome-shaped convex projections 44 In FIG. 3, an irradiated target area 46 is comprised of a plurality of surfaces defined by the dome-shaped projections 44. In that the radius of the dome-shaped projections 44 is less than the radius of the curved surface 32 in FIG. 2, the total ejection cone Θ" is greater than the total ejection cone Θ' of FIG. 2. Consequently, the surface 12 of the substrate 10 has a uniform film 48 which is again substantially larger than the irradiated target area 46.

Figure 4:
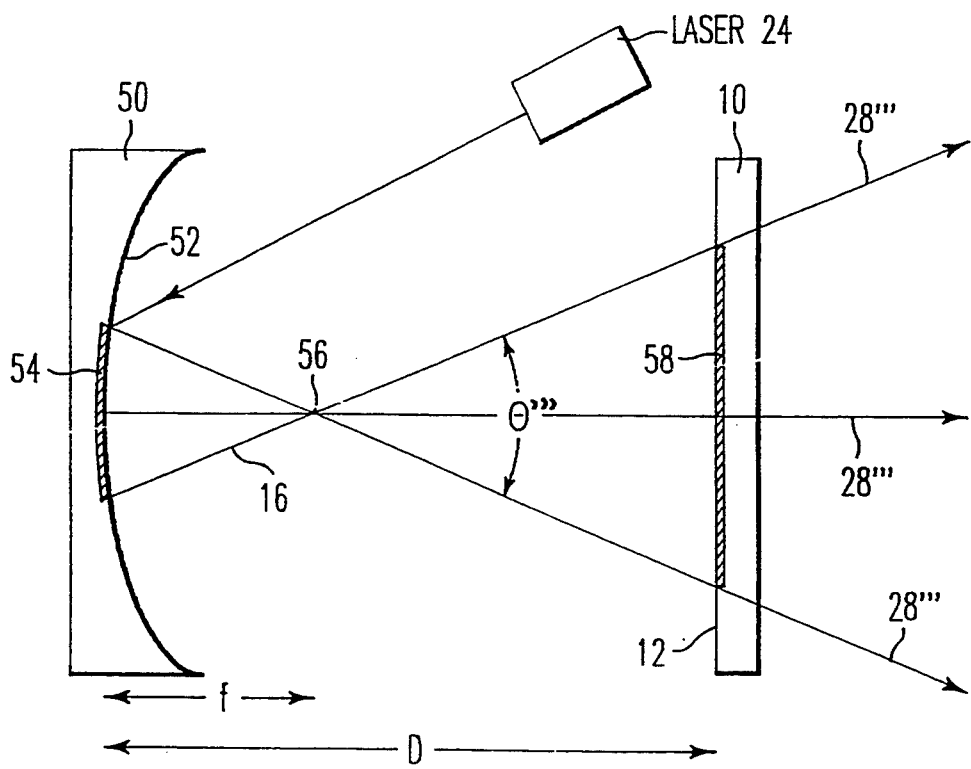
FIG. 4 is a schematic illustration of the process in accordance with the instant invention wherein the target has a concave, laser irradiated, target area.

Referring now to FIG. 4, there is shown a third embodiment of the invention wherein the target 50 has a concave surface 52 with a concave irradiated target area 54. The distance D of the target 50 from the surface 12 of the substrate 10 is greater than the focal length f to the focal point 56. If the quantity D−f is substantially greater than the distance f, then the area covered by the uniform film area 58 will be substantially larger than the irradiated target area 54. Again, the normal components 59 of the ejected material provide a total cone angle of Θ''' which in the illustrated embodiment is significantly larger than the angle Θ of FIG. 1. In the arrangement of FIG. 4, the film uniformity in the area 58 on substrate 10 may 10 well be further increased due to mixing of the material 16 at the focal point 56 due to collisions between particles of the ejected material with one another. As those skilled in art will appreciate, a plurality of concave surfaces may also be used in order to increase the deposition area similar to the plurality of convex surfaces shown in FIG. 3.

By curving the surfaces 32 (FIG. 2), 42 (FIG. 3) and 52 (FIG. 4), it is seen that target geometries where the laser irradiated surface is not flat increases the area of uniformly deposited films (such as films 36, 48 and 58) over the area of films (such as the film 14 of FIG. 1). Accordingly, the size of the laser ablated films possessing uniform composition and thickness can be significantly increased without having to move the substrate 10 or the laser beam 22. This is so because for laser ablation processes, the material 16 is ejected from the target 18, 30, 40 and 50 in small cones α having centroids 28 which are always normal to the surface of the target. By placing a substrate 10 with a surface 12 perpendicular to the normal target vector, at an appropriate distance away from the target, films having uniform, heavy elemental composition and uniform thickness are grown within the cone Θ. By utilizing a finite width laser beam 22 and by designing the target with surface normals such as those which occur in FIGS. 2–4, films of larger areas possessing uniform composition and thickness, can be grown by effectively increasing the size of the cone defined by the angle Θ.

From the foregoing description, one skilled in the art can easily ascertain the essential characteristics of this invention, and without departing from the spirit and scope thereof, can make various changes and modifications of the invention to adapt it to various usages and conditions.

What is claimed:

1. In a method of ablating a target material of the type wherein the target material is irradiated with a laser so as to the improvement comprising:
    forming the target material such that the target material is in the shape of a plurality of distinct curved surfaces in juxtaposition with one another, wherein the curved surfaces are concave.

2. In a method of ablating a target material of the type wherein the target material is irradiated with a laser so as to deposit a film of the target material on a device, the improvement comprising:
    forming the target material such that the target material is of a curved concave shape, wherein the target material has a focal point for material ejected therefrom by laser ablation positioned a first selected distance from the irradiated target area and wherein the surface of the target is positioned a second distance from the irradiated target area, whereby an area of film deposition is substantially greater that the size of the target material, and whereby the target material mixes at the focal point due to collisions so as to further increase film uniformity.

3. An improved laser ablation apparatus of the type having a target made of material of predetermined composition and dimension wherein the improvement comprises:
    the target being of a curved shape, wherein the target is comprised of a plurality of juxtaposed concave surfaces.

* * * * *